United States Patent
Lin et al.

(10) Patent No.: US 9,197,229 B2
(45) Date of Patent: Nov. 24, 2015

(54) PANEL DRIVING CIRCUIT AND RING OSCILLATOR CLOCK AUTOMATIC SYNCHRONIZATION METHOD THEREOF

(71) Applicant: Raydium Semiconductor Corporation, Hsinchu (TW)

(72) Inventors: Feng-Li Lin, Hsinchu County (TW); Hung Li, Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 14/493,857

(22) Filed: Sep. 23, 2014

(65) Prior Publication Data

US 2015/0084679 A1     Mar. 26, 2015

(30) Foreign Application Priority Data

Sep. 23, 2013   (TW) .............................. 102134181 A

(51) Int. Cl.
*H03L 7/00* (2006.01)
*H03L 7/23* (2006.01)

(52) U.S. Cl.
CPC ....................... *H03L 7/23* (2013.01)

(58) Field of Classification Search
USPC .................................. 327/147–149, 156–160
See application file for complete search history.

(56) References Cited

U.S. PATENT DOCUMENTS

| 5,574,407 | A | * | 11/1996 | Sauer et al. | ...................... 331/14 |
| 6,038,276 | A | * | 3/2000 | Dinh | .............................. 375/376 |
| 6,310,653 | B1 | * | 10/2001 | Malcolm et al. | ............... 348/537 |
| 6,912,012 | B2 | * | 6/2005 | Renner et al. | .................. 348/536 |
| 6,998,886 | B1 | * | 2/2006 | Chiu | ............................. 327/150 |
| 2012/0081023 | A1 | * | 4/2012 | McCune, Jr. | .................. 315/246 |
| 2012/0081035 | A1 | * | 4/2012 | McCune, Jr. | .................. 315/297 |
| 2015/0084679 | A1 | * | 3/2015 | Lin et al. | ....................... 327/160 |

* cited by examiner

*Primary Examiner* — Adam Houston

(57) ABSTRACT

A ring oscillator clock automatic synchronization method of a panel driving circuit includes steps of: when a vertical blanking interval happens, a master driver generates a pulse signal to slave drivers respectively. A pulse width of the pulse signal equals to N times of a master ring oscillator clock, wherein N is larger than 0. When a slave driver receives the pulse signal, the slave driver uses its slave ring oscillator clock to count the pulse width of the pulse signal to obtain that the pulse width of the pulse signal equals to M times of the slave ring oscillator clock, wherein M is larger than 0. The slave driver compares M with N and automatically adjusts the slave ring oscillator clock according to the comparison result to make it achieve synchronization with the master ring oscillator clock.

10 Claims, 2 Drawing Sheets

_PANEL DRIVING CIRCUIT AND RING OSCILLATOR CLOCK AUTOMATIC SYNCHRONIZATION METHOD THEREOF_

BACKGROUND OF THE INVENTION

1. Field of the Invention

This invention relates to a display apparatus, especially to a panel driving circuit and a ring oscillator clock automatic synchronization method thereof.

2. Description of the Related Art

In conventional LCD display apparatus, the panel driving circuit of the panel includes driving ICs coupled in series, and each driving IC is integrated with a timing controller and includes a ring oscillator to provide clock for the gate/source control signals.

In practical applications, in order to make all gate/source outputs achieve synchronization, the ideal condition is that all ring oscillators in the driving ICs have the same frequency. However, since the ring oscillators in the driving ICs cannot be all the same due to the process differences, the display quality of the LCD display apparatus would be poor due to vertical blocks or horizontal blocks shown on the screen of the LCD display apparatus.

Therefore, the invention provides a panel driving circuit and a ring oscillator clock automatic synchronization method thereof to solve the above-mentioned problems occurred in the prior arts.

SUMMARY OF THE INVENTION

An embodiment of the invention is a ring oscillator clock automatic synchronization method. In this embodiment, the ring oscillator clock automatic synchronization method is applied in a panel driving circuit of a panel, but not limited to this.

In this embodiment, the panel driving circuit includes a master driver and a plurality of slave drivers. The plurality of slave drivers is coupled to the master driver in series respectively. The master driver has a master ring oscillator clock. The ring oscillator clock automatic synchronization method includes steps of: when a vertical blanking interval of a timing happens, the master driver generating a pulse signal to the plurality of slave drivers respectively, wherein a pulse width of the pulse signal equals to N times of the master ring oscillator clock, and N is larger than 0; when a slave driver of the plurality of slave drivers receives the pulse signal, the slave driver using a slave ring oscillator clock to count the pulse width of the pulse signal to obtain that the pulse width of the pulse signal equals to M times of the slave ring oscillator clock, wherein M is larger than 0; and the slave driver comparing M with N to obtain a comparison result and automatically adjusting the slave ring oscillator clock according to the comparison result to make the slave ring oscillator clock achieve synchronization with the master ring oscillator clock.

In an embodiment, if the comparison result is M=N, the slave driver keeps the slave ring oscillator clock unchanged.

In an embodiment, if the comparison result is M>N, the slave driver slows the slave ring oscillator clock.

In an embodiment, if the comparison result is M<N, the slave driver tunes fast the slave ring oscillator clock.

Another embodiment of the invention is a panel driving circuit. In this embodiment, the panel driving circuit is applied in a panel. The panel driving circuit includes a master driver and a plurality of slave drivers. The master driver has a master ring oscillator clock. When a vertical blanking interval of a timing happens, the master driver generates a pulse signal, wherein a pulse width of the pulse signal equals to N times of the master ring oscillator clock, and N is larger than 0. The plurality of slave drivers is coupled to the master driver in series respectively. When a slave driver of the plurality of slave drivers receives the pulse signal, the slave driver uses a slave ring oscillator clock to count the pulse width of the pulse signal to obtain that the pulse width of the pulse signal equals to M times of the slave ring oscillator clock, wherein M is larger than 0. The slave driver compares M with N to obtain a comparison result and automatically adjusts the slave ring oscillator clock according to the comparison result to make the slave ring oscillator clock achieve synchronization with the master ring oscillator clock.

Compared to the prior art, the panel driving circuit and the ring oscillator clock automatic synchronization method disclosed by the invention have following advantages of:

(1) using a vertical blanking interval of a timing when the panel is normally operated, since no data will be inputted to the panel driving circuit in this period of time, no signal interference will be generated;

(2) the slave driver automatically adjusting the slave ring oscillator clock according to the comparison result of M and N to make the slave ring oscillator clock achieve synchronization with the master ring oscillator clock; therefore, the process differences among the ring oscillators in the driving ICs can be overcome, and the display quality of the LCD display apparatus can be improved due to no vertical blocks or horizontal blocks shown on the screen of the LCD display apparatus.

The advantage and spirit of the invention may be understood by the following detailed descriptions together with the appended drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

A preferred embodiment of the invention is a panel driving circuit. In this embodiment, the panel driving circuit is applied in a panel of a display apparatus to generate a gate electrode control signal and a source electrode control signal.

Figure 1:
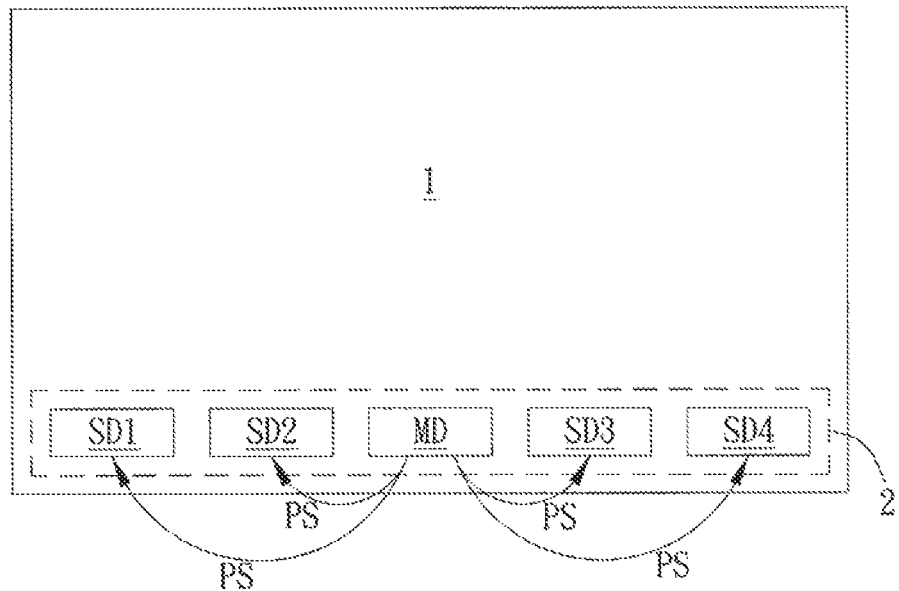
FIG. 1 illustrates a schematic diagram of a panel driving circuit applied in a panel including a plurality of drivers in an embodiment of the invention.

Please refer to FIG. 1. FIG. 1 illustrates a schematic diagram of a panel driving circuit applied in a panel including a plurality of drivers in this embodiment. As shown in FIG. 1, the panel driving circuit 2 applied in the panel 1 includes a plurality of drivers, and the plurality of drivers includes a master driver MD and a plurality of slave drivers SD1~SD4.

The plurality of slave drivers SD1~SD4 are coupled to the master driver MD in series respectively. It should be noticed that the number of the drivers in the panel driving circuit 2 can be adjusted based on practical needs of the panel 1, not limited to this.

When the panel 1 is normally operated, every once in a while there will be a vertical blanking interval occurred in the timing. During the vertical blanking interval of the timing, no data can be inputted to the panel driving circuit 2; therefore, no signal interference will be generated. When the vertical blanking interval of the timing happens, the master driver MD will generate a pulse signal PS to the plurality of slave drivers SD1~SD4 respectively, wherein a pulse width of the pulse signal PS equals to N times of a master ring oscillator clock of the master driver MD, and N is larger than 0. When any one of the slave drivers SD1~SD4 receives the pulse signal PS, the slave driver will use a slave ring oscillator clock to count the pulse width of the pulse signal PS to obtain that the pulse width of the pulse signal PS equals to M times of the slave ring oscillator clock, wherein M is larger than 0. Then, the slave driver will compare M with N to obtain a comparison result and automatically adjust the slave ring oscillator clock according to the comparison result to make the slave ring oscillator clock achieve synchronization with the master ring oscillator clock.

Figure 2:
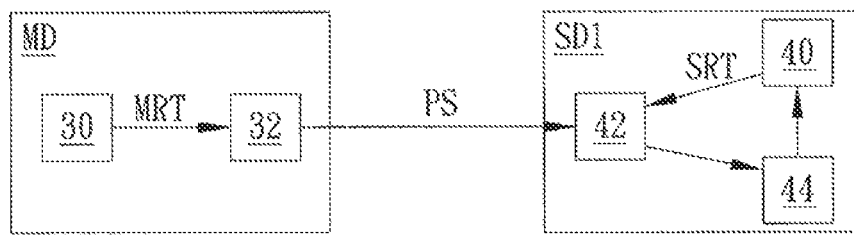
FIG. 2 illustrates a functional block diagram of a master driver MD and a slave driver SD1 in the panel driving circuit 2.

In this embodiment, each driver of the panel driving circuit 2 is integrated with a timing controller and includes a ring oscillator to provide clock for the gate/source control signals. Please refer to FIG. 2. FIG. 2 illustrates a functional block diagram of the master driver MD and the slave driver SD1 in the panel driving circuit 2.

As shown in FIG. 2, the master driver MD and the slave driver SD1 can be coupled through a tandem line, but not limited to this. The master driver MD includes a master ring oscillator 30 and a master counter 32. The master counter 32 is coupled to the master ring oscillator 30. The master ring oscillator 30 is used to generate a master ring oscillator clock MRT. The master counter 32 is used to count N times of the master ring oscillator clock MRT, so that when the vertical blanking interval of the timing happens, the pulse width of the pulse signal PS outputted by the master driver MD will equal to N times of the master ring oscillator clock MRT, wherein N is larger than 0.

The slave driver SD1 includes a slave ring oscillator 40, a slave counter 42, and a comparator 44. The slave counter 42 is coupled to the slave ring oscillator 40. The comparator 44 is coupled to the slave counter 42 and the slave ring oscillator 40. The slave ring oscillator 40 is used to generate the slave ring oscillator clock SRT. When the slave driver SD1 receives the pulse signal PS outputted by the master driver MD, the slave counter 42 will count the pulse width of the pulse signal PS according to the slave ring oscillator clock SRT to obtain that the pulse width of the pulse signal PS equals to M times of the slave ring oscillator clock SRT, wherein M is larger than 0.

Then, the comparator 44 will compare M with N to obtain a comparison result and automatically adjust the slave ring oscillator clock SRT generated by the slave ring oscillator 40 according to the comparison result to make the slave ring oscillator clock SRT of the slave driver SD1 achieve synchronization with the master ring oscillator clock MRT of the master driver MD.

If the comparison result obtained by the comparator 44 is M=N, it means that the slave ring oscillator clock SRT of the slave driver SD1 has achieved synchronization with the master ring oscillator clock MRT of the master driver MD; therefore, the slave driver SD1 will keep the slave ring oscillator clock SRT unchanged.

If the comparison result obtained by the comparator 44 is M>N, it means that the slave ring oscillator clock SRT of the slave driver SD1 is faster than the master ring oscillator clock MRT of the master driver MD; therefore, the slave driver SD1 will slow the slave ring oscillator clock SRT to make the slave ring oscillator clock SRT achieve synchronization with the master ring oscillator clock MRT.

If the comparison result obtained by the comparator 44 is M<N, it means that the slave ring oscillator clock SRT of the slave driver SD1 is slower than the master ring oscillator clock MRT of the master driver MD; therefore, the slave driver SD1 will tune fast the slave ring oscillator clock SRT to make the slave ring oscillator clock SRT achieve synchronization with the master ring oscillator clock MRT.

Similarly, the slave drivers SD2~SD4 can also automatically adjust their slave ring oscillator clocks SRT respectively as stated above to make the slave ring oscillator clock SRT achieve synchronization with the master ring oscillator clock MRT. Next, the master driver MD and the slave drivers SD1~SD4 of the panel driving circuit 2 will not repeat the above-mentioned operations until the next vertical blanking interval occurred in the timing.

Above all, no matter whether the ring oscillator clocks of the slave drivers SD1~SD4 and the master driver MD fail to be synchronized due to the process differences, the slave drivers SD1~SD4 can make their slave ring oscillator clocks SRT achieve synchronization with the master ring oscillator clock MRT of the master driver MD through the above-mentioned operations. Because all drivers in the panel driving circuit 2 of the panel 1 can provide the same ring oscillator clock, all gate electrode/source electrode outputs of the panel 1 can be synchronized, the display quality of the panel 1 can be improved due to no vertical blocks or horizontal blocks shown on the panel 1.

Figure 3:
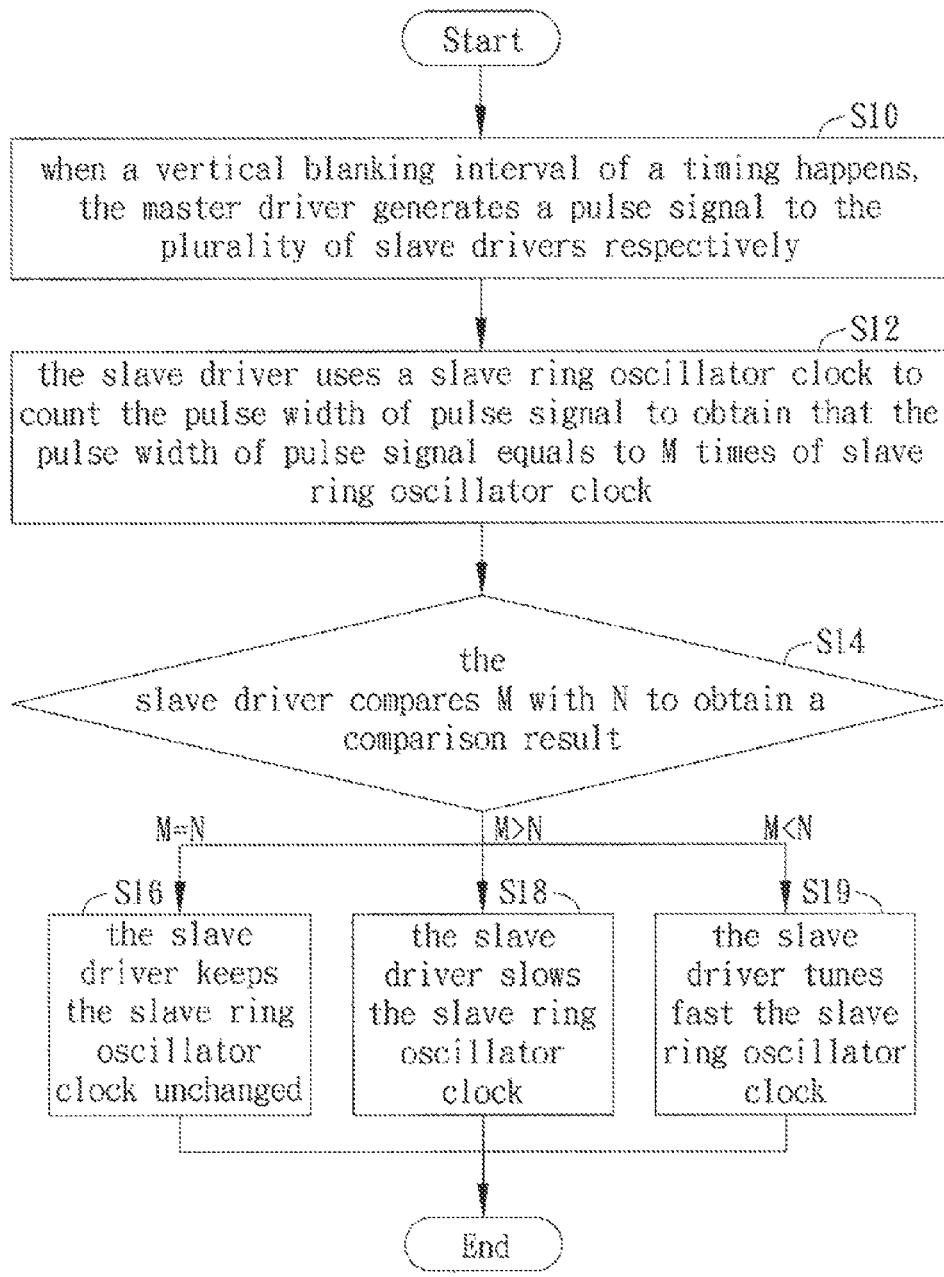
FIG. 3 illustrates a flow chart of the ring oscillator clock automatic synchronization method applied in a panel driving circuit in another embodiment of the invention.

Another embodiment of the invention is a ring oscillator clock automatic synchronization method. In this embodiment, the ring oscillator clock automatic synchronization method is applied in a panel driving circuit of a panel, but not limited to this. The panel driving circuit includes a master driver and a plurality of slave drivers. The plurality of slave drivers is coupled to the master driver in series respectively. The master driver has a master ring oscillator clock. Please refer to FIG. 3. FIG. 3 illustrates a flow chart of the ring oscillator clock automatic synchronization method applied in the panel driving circuit in this embodiment.

As shown in FIG. 3, at first, in the step S10, when a vertical blanking interval of a timing happens, the master driver generates a pulse signal to the plurality of slave drivers respectively, wherein a pulse width of the pulse signal equals to N times of the master ring oscillator clock, and N is larger than 0.

Next, in the step S12, when a slave driver of the plurality of slave drivers receives the pulse signal, the slave driver uses a slave ring oscillator clock to count the pulse width of the pulse signal to obtain that the pulse width of the pulse signal equals to M times of the slave ring oscillator clock, wherein M is larger than 0.

Then, in the step S14, the slave driver compares M with N to obtain a comparison result. And, the slave driver will also automatically adjust the slave ring oscillator clock according to the comparison result to make the slave ring oscillator clock achieve synchronization with the master ring oscillator clock.

If the comparison result of the step S14 is M=N, the step S16 is performed, the slave driver keeps the slave ring oscillator clock unchanged. If the comparison result of the step S14 is M>N, the step S18 is performed, the slave driver slows the slave ring oscillator clock. If the comparison result of the step S14 is M<N, the step S19 is performed, the slave driver tunes fast the slave ring oscillator clock.

Compared to the prior art, the panel driving circuit and the ring oscillator clock automatic synchronization method disclosed by the invention have following advantages of:

(1) using a vertical blanking interval of a timing when the panel is normally operated, since no data will be inputted to the panel driving circuit in this period of time, no signal interference will be generated;

(2) the slave driver automatically adjusting the slave ring oscillator clock according to the comparison result of M and N to make the slave ring oscillator clock achieve synchronization with the master ring oscillator clock; therefore, the process differences among the ring oscillators in the driving ICs can be overcome, and the display quality of the LCD display apparatus can be improved due to no vertical blocks or horizontal blocks shown on the screen of the LCD display apparatus.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

The invention claimed is:

1. A ring oscillator clock automatic synchronization method, applied in a panel driving circuit of a panel, the panel driving circuit comprising a master driver and a plurality of slave drivers, the plurality of slave drivers being coupled to the master driver in series respectively, the master driver having a master ring oscillator clock, the ring oscillator clock automatic synchronization method comprising steps of:

when a vertical blanking interval of a timing happens, the master driver generating a pulse signal to the plurality of slave drivers respectively, wherein a pulse width of the pulse signal equals to N times of the master ring oscillator clock, and N is larger than 0;

when a slave driver of the plurality of slave drivers receives the pulse signal, the slave driver using a slave ring oscillator clock to count the pulse width of the pulse signal to obtain that the pulse width of the pulse signal equals to M times of the slave ring oscillator clock, wherein M is larger than 0; and the slave driver comparing M with N to obtain a comparison result and automatically adjusting the slave ring oscillator clock according to the comparison result to make the slave ring oscillator clock achieve synchronization with the master ring oscillator clock.

2. The ring oscillator clock automatic synchronization method of claim 1, wherein if the comparison result is M=N, the slave driver keeps the slave ring oscillator clock unchanged.

3. The ring oscillator clock automatic synchronization method of claim 1, wherein if the comparison result is M>N, the slave driver slows the slave ring oscillator clock.

4. The ring oscillator clock automatic synchronization method of claim 1, wherein if the comparison result is M<N, the slave driver tunes fast the slave ring oscillator clock.

5. A panel driving circuit, applied in a panel, the panel driving circuit comprising:

a master driver having a master ring oscillator clock, when a vertical blanking interval of a timing happens, the master driver generating a pulse signal, wherein a pulse width of the pulse signal equals to N times of the master ring oscillator clock, and N is larger than 0; and a plurality of slave drivers, coupled to the master driver in series respectively, when a slave driver of the plurality of slave drivers receives the pulse signal, the slave driver using a slave ring oscillator clock to count the pulse width of the pulse signal to obtain that the pulse width of the pulse signal equals to M times of the slave ring oscillator clock, wherein M is larger than 0, and the slave driver comparing M with N to obtain a comparison result and automatically adjusting the slave ring oscillator clock according to the comparison result to make the slave ring oscillator clock achieve synchronization with the master ring oscillator clock.

6. The panel driving circuit of claim 5, wherein if the comparison result is M=N, the slave driver keeps the slave ring oscillator clock unchanged.

7. The panel driving circuit of claim 5, wherein if the comparison result is M>N, the slave driver slows the slave ring oscillator clock.

8. The panel driving circuit of claim 5, wherein if the comparison result is M<N, the slave driver tunes fast the slave ring oscillator clock.

9. The panel driving circuit of claim 5, wherein the master driver comprises:

a master ring oscillator, for generating the master ring oscillator clock; and a master counter, coupled to the master ring oscillator, for counting N times of the master ring oscillator clock, so that the pulse width of the pulse signal outputted by the master driver equals to N times of the master ring oscillator clock.

10. The panel driving circuit of claim 5, wherein the slave driver comprises:

a slave ring oscillator, for generating the slave ring oscillator clock; a slave counter, coupled to the slave ring oscillator, for counting the pulse width of the pulse signal to obtain that the pulse width of the pulse signal equals to M times of the slave ring oscillator clock; and a comparator, coupled to the slave ring oscillator and the slave counter, for comparing M with N to obtain a comparison result and automatically adjusting the slave ring oscillator clock according to the comparison result to make the slave ring oscillator clock achieve synchronization with the master ring oscillator clock.

* * * * *